(12) United States Patent
Van Der Heide et al.

(10) Patent No.: US 11,867,786 B2
(45) Date of Patent: Jan. 9, 2024

(54) PARAMETER MAP DETERMINATION FOR TIME DOMAIN MAGNETIC RESONANCE

(71) Applicant: UMC Utrecht Holding B.V., Utrecht (NL)

(72) Inventors: Oscar Van Der Heide, Utrecht (NL); Alessandro Sbrizzi, Utrecht (NL); Cornelis Antonius Theodorus Van Den Berg, Utrecht (NL)

(73) Assignee: UMC Utrecht Holding B.V., Utrecht (NL)

( * ) Notice: Subject to any disclaimer, the term of this patent is extended or adjusted under 35 U.S.C. 154(b) by 0 days.

(21) Appl. No.: 17/602,259

(22) PCT Filed: Apr. 8, 2020

(86) PCT No.: PCT/EP2020/059997
§ 371 (c)(1),
(2) Date: Oct. 7, 2021

(87) PCT Pub. No.: WO2020/208066
PCT Pub. Date: Oct. 15, 2020

(65) Prior Publication Data
US 2022/0163611 A1 May 26, 2022

(30) Foreign Application Priority Data
Apr. 8, 2019 (NL) .................................... 2022890

(51) Int. Cl.
*G01R 33/56* (2006.01)
*G01R 33/50* (2006.01)
*G01R 33/561* (2006.01)

(52) U.S. Cl.
CPC ......... *G01R 33/5608* (2013.01); *G01R 33/50* (2013.01); *G01R 33/561* (2013.01)

(58) Field of Classification Search
CPC ... G01R 33/50; G01R 33/5608; G01R 33/561
See application file for complete search history.

(56) References Cited

U.S. PATENT DOCUMENTS

2016/0282434 A1* 9/2016 Seiberlich .............. G01R 33/50
2017/0205482 A1* 7/2017 Zhao ...................... G01R 33/50
(Continued)

FOREIGN PATENT DOCUMENTS

| CN | 103705239 A | 4/2014 |
|----|-------------|--------|
| CN | 107110938 A | 8/2017 |

(Continued)

OTHER PUBLICATIONS

Ananya Panda, et al., Magnetic Resonance Fingerprinting—An Overview, Curr Opin Biomed Eng. Sep. 2017, 3: pp. 56-66; total 19 pages.

(Continued)

*Primary Examiner* — Gregory H Curran
(74) *Attorney, Agent, or Firm* — Snell & Wilmer L.L.P.

(57) ABSTRACT

The present patent disclosure describes a new method and a new device for determining a spatial distribution of at least one tissue parameter within a sample based on a time domain magnetic resonance, TDMR, signal emitted from the sample after excitation of the sample according to an applied pulse sequence. The spatial distribution is determined using a calculated sparse Hessian, wherein the sparse Hessian is calculated based on the applied pulse sequence.

16 Claims, 10 Drawing Sheets

(56) References Cited

U.S. PATENT DOCUMENTS

2018/0031667 A1 2/2018 Sarracanie et al.
2020/0191893 A1* 6/2020 Grodzki ................. G01R 33/54

FOREIGN PATENT DOCUMENTS

| CN | 107527339 A | 12/2017 |
| CN | 108647183 A | 10/2018 |
| EP | 3093677 A1 | 11/2016 |

OTHER PUBLICATIONS

Gopal Nataraj, et al., Dictionary-Free MRI PERK: Parameter Estimation via Regression with Kernels, IEEE Transactions on Medical Imaging, Sep. 2018, vol. 37, No. 9, pp. 2103-2114; total 12 pages.
Pierre Ablin, et al., Faster Independent Component Analysis by Preconditioning With Hessian Approximations, IEEE Transactions on Signal Processing, Aug. 1, 2018, vol. 66, N.15, pp. 4040-4049 (as literature to disclose a well-known art); total 10 pages.
G. Wübbeler et al., A Large-Scale Optimization Method Using a Sparse Approximation of the Hessian for Magnetic Resonance Fingerprinting, SIAM Journal on Imaging Sciences, vol. 10, No. 3, Jul. 18, 2017, pp. 979-1004.
Oscar Van Der Heide et al., High-resolution in-vivo multi-parametric MRI using MR-STAT with a highly parallelized, limited-memory reconstruction algorithm, Proceedings of the International Society for Magnetic Resonance in Medicine, ISMRM, Joint Annual Meeeting ISMRM-ESMRMB, Paris, France, Jun. 16-21, 2018, No. 266, Jun. 1, 2018.
Oscar Van Der Heide et al., Sparse MR-STAT:Order of magnitude acceleration in reconstruction times, Proceedings of the International Society for Magnetic Resonance in Medicine, ISMRM, 27th Annual Meeting and Exhibition, Montreal, Quebec, Canada, May 11-May 16, 2019, No. 4538, Apr. 26, 2019.
Written Opinion of the International Searching Authority dated Jul. 17, 2020 in corresponding International Application No. PCT/EP2020/059997 filed Apr. 8, 2020; total 13 pages.
International Search Report dated Jul. 17, 2020 in corresponding International Application No. PCT/EP2020/059997 filed Apr. 8, 2020; total 5 pages.
Alessandro Sbrizzi, et al., Fast quantitative MRI as a nonlinear tomography problem, arXiv, 2017, 1705.03209v2,1-22.
Andrea Walther,Computing Sparse Hessians with Automatic Differentiation, ACM Transactions on Mathematical Software,2008, vol. 34, No. 1, Article 3,1-15.
Office Action dated Sep. 23, 2023 and Search Report dated Sep. 15, 2023 in corresponding Chinese Application No. 202080041106.X filed Apr. 8, 2020; total 7 pages.

* cited by examiner

PARAMETER MAP DETERMINATION FOR TIME DOMAIN MAGNETIC RESONANCE

CROSS-REFERENCE TO RELATED APPLICATIONS

The present application is a U.S. National Stage entry under 35 U.S.C. § 371 of International Application No. PCT/EP2020/059997, filed Apr. 8, 2020, which claims priority to and the benefit of Netherlands Application No. 2022890, filed Apr. 4, 2019, which applications are hereby incorporated by reference in their entirety.

FIELD

The present patent disclosure relates to a method and a device for determining a spatial distribution of at least one tissue parameter within a sample on a time domain magnetic resonance, TDMR, signal emitted from the sample after excitation of the sample according to an applied pulse sequence, and a computer program product for performing the method.

BACKGROUND

Magnetic resonance imaging (MRI) is an imaging modality used for many applications and with many sequence parameters that can be tuned and many imaging parameters that can be observed to extract e.g. different kinds of biological information. Conventional MRI image reconstruction involves acquiring a k-space signal and performing inverse fast Fourier transform (EFT) on the acquired data. Conventional MRI imaging is slow because for every parameter to be measured (e.g. $T_1$ or $T_2$) a separate MRI measurement is to be acquired with the MRI device having different settings. A scan can take as much 30-45 minutes.

Magnetic resonance spin tomography in the time domain (MR-STAT) is a quantitative method to obtain MR images directly from time domain data. Particularly, MR-STAT is a framework for obtaining multi-parametric quantitative MR maps using data from single short scans.

As described in WO 2016/184779 A1, a large-scale optimization problem is solved in which spatial localization of signal and estimation of tissue parameters are performed simultaneously by directly fitting a Bloch-based volumetric signal model to the time domain data using an inexact Gauss-Newton method. A highly parallelized, matrix-free inexact Gauss-Newton reconstruction algorithm can be used to solve the large-scale optimization problem for high-resolution scans.

G. Wübbeler et al., in "A Large-Scale Optimization Method Using a Sparse Approximation of the Hessian for Magnetic Resonance Fingerprinting", SIAM JOURNAL ON IMAGING SCIENCES, vol. 10, nr. 3, 18 Jul. 2017, pp. 979-1004, describe a least-squares approach to Magnetic Resonance Fingerprinting (MRF) wherein a sparse approximation of a Hessian is used.

Although the measurement time is highly reduced to the order of several minutes, the computation time for fitting the signal model to the time domain data is about 1 hour for a single 2D slice.

SUMMARY

It is an object among objects of the present patent disclosure to improve the conversion of the time domain MR signal to the quantitative MR maps.

According to a first aspect, there is provided a method, preferably a computer implemented method, for determining a spatial distribution of at least one tissue parameter within a sample based on a time domain magnetic resonance, TDMR, signal emitted from the sample after excitation of the sample according to an applied pulse sequence, the method comprising:
  i) determining a TDMR signal model to approximate the emitted time domain magnetic resonance signal, wherein the TDMR signal model is configured to be dependent on TDMR signal model parameters comprising:
    the spatial distribution of the at least one tissue parameter within the sample; and
    the applied pulse sequence;
  ii) estimating an initial set of TDMR signal model parameters;
  iii) determining a residual vector being representative for a difference between the emitted TDMR signal and the TDMR signal model, based on the initial set of TDMR signal model parameters as an input;
  iv) determining an updated set of TDMR signal model parameters by
  v) calculating a gradient of the residual vector;
  vi) calculating a sparse Hessian of the TDMR signal model, the calculated sparse Hessian having a sparsity pattern that is calculated using the applied pulse sequence; and
  vii) updating the initial set of TDMR signal model parameters based on the calculated gradient and calculated Hessian;
  viii) repeating steps iii), iv), v), vi) and vii) for the updated set of TDMR signal model parameters as the input until the difference between the emitted TDMR signal and the TDMR signal model is smaller than a predefined threshold or until a predetermined number of repetitions is completed, thereby obtaining a final updated set of TDMR signal model parameters; and
  ix) extracting from the final updated set of TDMR signal model parameters the spatial distribution of the at least one tissue parameter.

When repeating the steps iii), iv), v), vi), and vii), instead of the initial set of TDMR signal model parameters, the updated set of TDMR signal model parameters is used. In this way, the updated set of TDMR signal model parameters iteratively converges to a final updated set of TDMR signal model parameters. In general, any stopping criterion, of which the above noted difference being smaller than a predefined threshold and predetermined number of repetitions represent examples, may be used. Thus, the repeating 150 step may be done until a stopping criterion is fulfilled.

"Sparse" is used in the present disclosure to indicate that the Hessian, which is a matrix, contains elements (e.g. more than half of the total number of elements) that are zero or negligible. For example, a sparsity of the sparse Hessian is the number of zero-valued and negligible elements of the Hessian divided by the total number of elements of the Hessian. The sparsity of the calculated Hessian in step vi) is based on the applied pulse sequence. More particularly, the Hessian has a sparsity pattern, such as a sparsity pattern comprising diagonal bands of non-zero and non-negligible elements. The applied pulse sequence is selected such that the Hessian is a sparse Hessian having a certain sparsity pattern.

In the present method, the computation time is reduced by at least a factor 10 as compared to the inexact Gauss-Newton method. In the latter method, for approximating the Hessian, partial derivatives of the signal with respect to each parameter have to be computed, which requires a large amount of computation time. To the contrary, in the present method, the Hessian, being a sparse Hessian, is computed upfront and stored for each set of TDMR signal model parameters, such that there is no need to calculate these partial derivatives for each parameter. Also, the memory needs of the present method can be as low as 0.04% of the memory needs of the inexact Gauss-Newton method.

In G. Wübbeler et al., the approximation of the sparse Hessian is an approximation that is independent of the applied pulse sequence, since the approximation of $P_1^T P_1 \approx (M_1/N)I_N$ results in the sparse Hessian to always only have one single parameter per diagonal band of the sparse Hessian matrix. In the present application, on the other hand, the sparse Hessian is determined base don the applied pulse sequence, and bandwidths larger than 1 are allowed. This results in at least one, or even two, orders of magnitude reduction in the required calculation time.

It is noted that although a residual vector is determined, this residual vector could also be named a residual function.

Preferably, in the calculating of the Hessian of the TDMR signal model as a sparse Hessian, a sparsity pattern of the Hessian is based on the applied pulse sequence.

In an embodiment, the applied pulse sequence comprises a gradient encoding pattern and/or a radio frequency excitation pattern, and the sparsity pattern of the Hessian is determined based on the gradient encoding pattern and/or the radio frequency excitation pattern.

In an embodiment, the Hessian is calculated as the product of a Jacobian of the residual vector and a Hermitian transpose of the Jacobian of the residual vector. Instead of the Jacobian of the residual vector, it would be equivalent to take the Jacobian, and the corresponding Hermitian transpose, of the TDMR signal model. The gradient encoding pattern determines the k-space sampling trajectory, e.g. Cartesian, radial, spiral.

In an embodiment, the applied pulse sequence is configured to yield any one of a Cartesian acquisition, radial acquisition, or spiral acquisition. For these types of pulse sequences, suitably the sparsity pattern comprises a number of diagonal bands of non-negligible elements in the Hessian. The other elements are preferably zero or negligible.

According to an embodiment, the gradient encoding pattern of the applied pulse sequence is configured to yield a Cartesian acquisition, such that a corresponding point-spread function only propagates in a phase encoding direction. There may also be two point-spread functions, such as for 3D acquisitions, each point-spread function being associated with a corresponding one of two phase encoding directions. Each of these two phase encoding directions is different.

In an embodiment, the applied pulse sequence is configured to yield varying flip angles.

Preferably, the radio frequency excitation pattern of the applied pulse sequence is configured to yield smoothly varying flip angles, such that a corresponding point-spread function is spatially limited in a width direction. Smoothly varying may indicate a sequence wherein the amplitude of the RF excitations changes in time by a limited amount. The amount of change between two consecutive RF excitations during sampling of a k-space (or of each k-space) is smaller than a predetermined amount, preferably smaller than 5 degrees.

More preferably or alternatively, the radio frequency excitation pattern of the applied pulse sequence is configured to yield smoothly varying flip angle within the sampling of a k-space, or each k-space of a plurality of k-spaces, such that a corresponding point-spread function is spatially limited in a width direction.

In an embodiment, the at least one tissue parameter comprises any one of a T1 relaxation time, T2 relaxation time, T2* relaxation time and a proton density, or a combination thereof.

In an embodiment, the calculating the gradient of the residual vector comprises multiplying the residual vector with a Hermitian transpose of a Jacobian of the residual vector. Instead of the Jacobian of the residual vector, it would be equivalent to take the Jacobian, and the corresponding Hermitian transpose, of the TDMR signal model.

In an embodiment, the TDMR signal model is a Bloch based volumetric signal model. It will be apparent from reading the present disclosure that the method can be performed with alternative volumetric signal models.

In an embodiment, the sparsity pattern in the Hessian is determined by the gradient encoding pattern of the applied pulse sequence. The applied pulse sequence may be selected to obtain a suitably sparse Hessian, in particular having suitable sparsity patterns.

In an embodiment, the Hessian is calculated as a sparse Hessian comprising a number of diagonal bands. The sparsity pattern may comprise the number of diagonal bands. In other words, the diagonal bands of non-negligible elements of the Hessian represent one type of sparsity pattern.

In an embodiment, the number of diagonal bands in the Hessian is determined by the gradient encoding pattern of the applied pulse sequence. As a first example, it is determined that a Cartesian acquisition provides a suitable sparsity pattern of one diagonal band per model parameter. As a second example, it is determined that radial and spiral acquisitions provide a suitable sparsity pattern of 4 diagonal bands per model parameter.

In an embodiment, a width of any one of the number of diagonal bands is determined by the radio frequency excitation pattern of the applied pulse sequence.

In an embodiment, the width of any one of the number of diagonal bands is larger than 1, wherein preferably the width of any one of the number of diagonal bands is in the range of 2 to 55, more preferably 3 to 8, most preferably 3. Width may indicate a number elements/coefficients per row of the sparse Hessian matrix.

In an embodiment, the sparse Hessian is constant for each set of TDMR signal model parameters. Preferably a set of TDMR signal model parameter changes is obtained by solving a linear system of equations based on the sparse Hessian and the gradient of the residual function.

In an embodiment, the step vii) of updating comprises:
  obtaining a set of TDMR signal model parameter changes by solving a linear system of equations of the sparse Hessian multiplied with the TDMR signal model parameter changes equal to minus the gradient of the residual function, and
  adding the obtained TDMR signal model parameter changes to the set of TDMR signal model parameters being updated to obtain the updated set of TDMR signal model parameters.

According to a second aspect of the present patent disclosure, there is provided a device for determining a spatial distribution of at least one tissue parameter within a sample based on a time domain magnetic resonance, TDMR, signal emitted from the sample after excitation of the sample according to an applied pulse sequence, the device comprising a processor which is configured to:

i) determine a TDMR signal model to approximate the emitted time domain magnetic resonance signal, wherein the TDMR signal model is configured to be dependent on TDMR signal model parameters comprising:
  the spatial distribution of the at least one tissue parameter within the sample; and
  the applied pulse sequence;
ii) estimate an initial set of TDMR signal model parameters;
iii) determine a residual vector being representative for a difference between the emitted TDMR signal and the TDMR signal model, based on the initial set of TDMR signal model parameters as an input;
iv) determine an updated set of TDMR signal model parameters by
v) calculate a gradient of the residual vector;
vi) calculate a sparse Hessian of the TDMR signal model, the calculated sparse Hessian having a sparsity pattern that is calculated using the applied pulse sequence; and
vii) update the initial set of TDMR signal model parameters based on the calculated gradient and calculated Hessian;
viii) repeat steps iii), iv), v), vi) and vii) for the updated set of TDMR signal model parameters as the input until the difference between the emitted TDMR signal and the TDMR signal model is smaller than a predefined threshold or until a predetermined number of repetitions is completed, whereby a final updated set of TDMR signal model parameters is obtained; and
ix) extract from the final updated set of TDMR signal model parameters the spatial distribution of the at least one tissue parameter.

As will be apparent, the device according to the second aspect is in particular configured for applying any one or more of the method steps described above and/or below. In addition, it will be apparent that any of the advantages mentioned for the method(s) and method steps described herein apply to the device and advantages mentioned for the device apply to the corresponding method(s) and method steps.

According to a further aspect, there is provided a computer program product comprising computer-executable instructions for performing the method of any one method according to any one of the steps of any one of the embodiments described above and/or below, when the program is run on a computer.

According to a further aspect, there is provided a computer program comprising computer-executable instructions to perform the method according to any one of the steps of any one of the embodiments described above and/or below, when the program is executed on a computer.

According to a further aspect, there is provided a computer device or other hardware device programmed to perform one or more steps of any one of the embodiments of the method described above and/or below.

According to another aspect there is provided a data storage device encoding a program in machine-readable and machine-executable form to perform one or more steps of any one of the embodiments of the method described above and/or below.

The accompanying drawings are used to illustrate presently preferred non-limiting exemplary embodiments of devices of the present disclosure. The above and other advantages of the features and objects of the disclosure will become more apparent and the aspects and embodiments will be better understood from the following detailed description when read in conjunction with the accompanying drawings, in which:

DESCRIPTION

Figure 1:
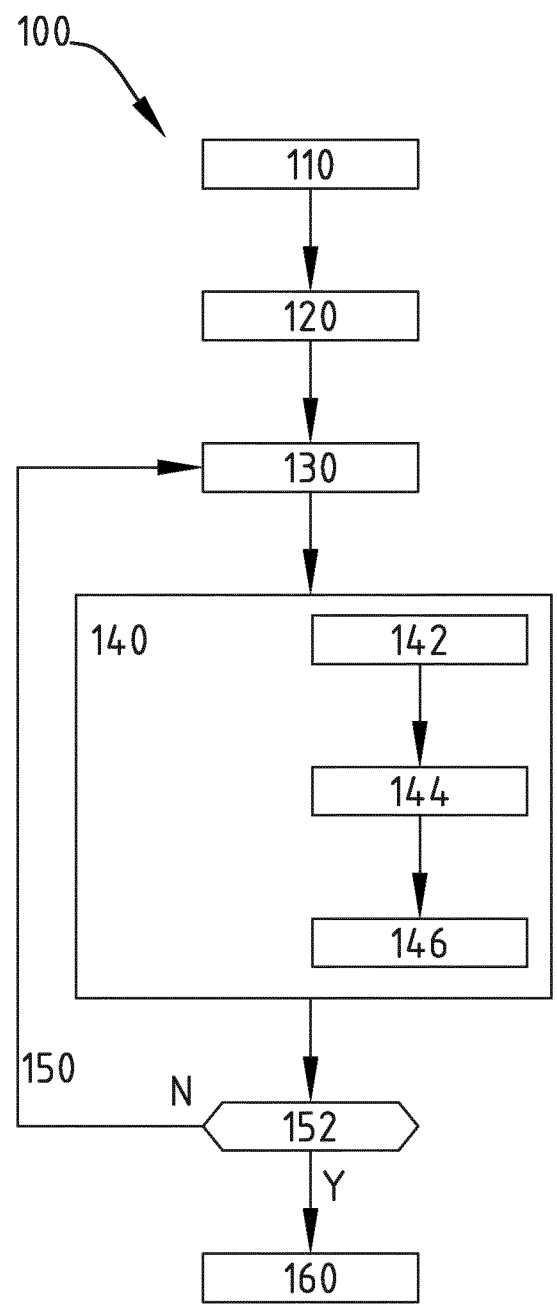
FIG. 1 is a flowchart illustrating an embodiment of an exemplary method of determining a spatial distribution.

Referring to FIG. 1, there is shown a method 100 for determining a spatial distribution of at least one tissue parameter within a sample based on a time domain magnetic resonance, TDMR, signal emitted from the sample after excitation of the sample according to an applied pulse sequence. The method 100 comprises the steps of:
  i) determining 110 a TDMR signal model to approximate the emitted time domain magnetic resonance signal, wherein the TDMR signal model is configured to be dependent on TDMR signal model parameters comprising:
   the spatial distribution of the at least one tissue parameter within the sample; and
   the applied pulse sequence;
ii) estimating 120 an initial set of TDMR signal model parameters;
iii) determining 130 a residual vector being representative for a difference between the emitted TDMR signal and the TDMR signal model, based on the initial set of TDMR signal model parameters as an input;
iv) determining 140 an updated set of TDMR signal model parameters based on the input set of TDMR signal model parameters. The input set of TDMR signal model parameters is the initial set of TDMR signal model parameters at the first iteration, and thereafter the updated set of TDMR signal model parameters. The signal model parameters are thus iteratively updated to obtain the fitting result. The determining 140 comprises:
v) calculating 142 a gradient of the residual vector;
vi) calculating 144 a Hessian of the TDMR signal model as a sparse Hessian; and
vii) updating 146 the input set of TDMR signal model parameters based on the calculated gradient and calculated Hessian thereby obtaining an updated set of TDMR signal model parameters;
viii) repeating 150 steps iii), iv), v), vi) and vii) for the updated set of TDMR signal model parameters until it is determined 152 that the difference between the emitted TDMR signal and the TDMR signal model is smaller than a predefined threshold or until a predetermined number of repetitions is completed, thereby obtaining a final updated set of TDMR signal model parameters. In general, any stopping criterion may be used. Thus, the repeating 150 may be done until a stopping criterion is fulfilled.

Thereafter, step ix) is performed of extracting 160 from the final updated set of TDMR signal model parameters the spatial distribution of the at least one tissue parameter.

The extracted spatial distribution allows for obtaining MR distribution maps, or in other words, MR images such as slices and the like of the sample.

When repeating the steps iii), iv), v), vi), and vii), instead of the initial set of TDMR signal model parameters, the updated set of TDMR signal model parameters is used. In this way, the updated set of TDMR signal model parameters iteratively converges to a final updated set of TDMR signal model parameters.

In the calculating of the Hessian of the TDMR signal model as a sparse Hessian, the sparse Hessian may have a sparsity pattern based on the applied pulse sequence.

In an embodiment, the sparsity pattern of the Hessian is determined based on the gradient encoding pattern and/or the radio frequency excitation pattern.

In an embodiment, the calculating 144 of the sparse Hessian $\tilde{H}$ is done by calculating the Hessian as the product of a Jacobian of the residual vector and a Hermitian transpose of the Jacobian of the residual vector. Instead of the Jacobian of the residual vector, it would be equivalent to take the Jacobian and corresponding Hermitian transpose of the TDMR signal model.

In an embodiment, the calculating 142 of the gradient of the residual vector comprises multiplying the residual vector with a Hermitian transpose of a Jacobian of the residual vector. Instead of the Hermitian transpose of the Jacobian of the residual vector, it would be equivalent to take the Hermitian transpose of the TDMR signal model.

In an embodiment, the calculating 144 of the Hessian is done by calculating the Hessian as a sparse Hessian comprising a number of diagonal bands. The sparsity pattern may comprise the number of diagonal bands. In other words, the diagonal bands of non-negligible elements of the Hessian represent one type of sparsity pattern. The other elements are zero or otherwise negligible. An element may for instance be considered negligible if its (absolute) value is below a threshold value. The threshold value may be predetermined.

In an embodiment, the number of diagonal bands in the Hessian is determined by the gradient encoding pattern of the applied pulse sequence. As a first example, it is determined that a Cartesian acquisition provides a suitable sparsity pattern of one diagonal band per model parameter. As a second example, it is determined that radial and spiral acquisitions provide a suitable sparsity pattern of 4 diagonal bands per model parameter.

In an embodiment, a width of any one of the number of diagonal bands is determined by the radio frequency excitation pattern of the applied pulse sequence.

Figure 2:
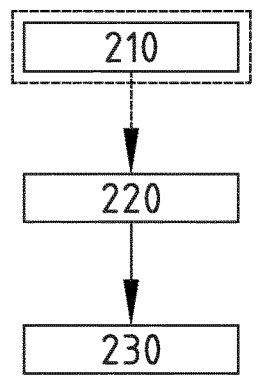
FIG. 2 is a flowchart illustrating an embodiment of determining of an updated set of TDMR signal model parameters of the method of FIG. 1.

As an example, as shown in FIG. 2, in the determining 140 of the updated set of TDMR signal model parameters, which includes the calculating 144 of the sparse Hessian, the following may be comprised: determining 210 elements/coefficients of the Hessian matrix which are non-negligible. Non-negligible may indicate that e.g. the absolute value of each element of the product of a Jacobian of the residual vector and the Hermitian transpose of the Jacobian of the residual vector is larger than a predetermined value, e.g. 0.1, 0.2, 0.3, 0.4, 0.5, . . . , 1. The predetermined value may be chosen to allow for a sufficiently accurate reconstruction of the parameter maps. The step of determining 210 is optional, since this may be determined beforehand for an applied pulse sequence. Only the non-negligible elements are then evaluated 220 and stored 230. The resulting matrix is a sparse approximation Hessian $\tilde{H}$ (SAH) to the true Hessian matrix. This approximation can be quickly computed and stored since for the present method and applied pulse sequences only a fraction of the coefficients is non-negligible. Since a clear relationship exists between sparsity pattern (e.g. the indexes of the non-negligible SAH coefficients) and the acquisition strategy, one knows in advance the coefficients which need to be computed. All the other (negligible) coefficients are not computed. This results in drastic computational and memory savings.

Figure 3:
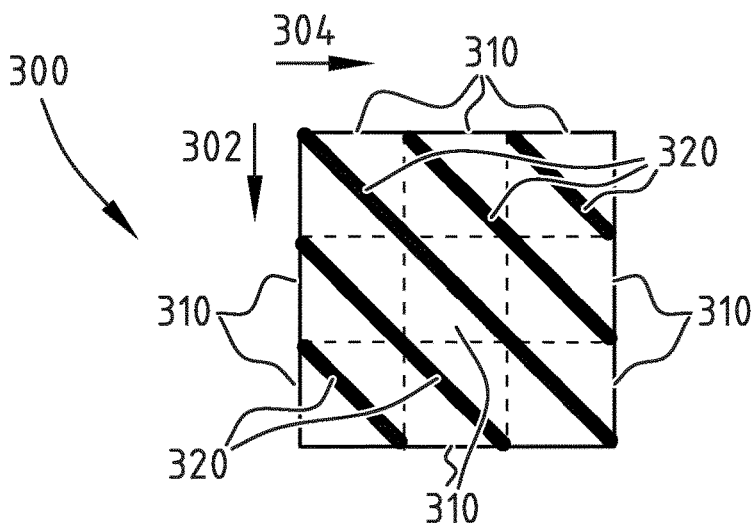
FIG. 3 is a schematic drawing of a sparse Hessian matrix for an applied pulse sequence wherein a Cartesian sampling strategy is used.

The gradient encoding pattern determines the sparsity pattern of the SAH matrix. For Cartesian acquisition a point spread function which propagates only in the phase encoding direction. This results into banded diagonal blocks in the SAH matrix. FIG. 3 shows an example of a determined sparsity pattern for the SAH matrix 300 for Cartesian acquisition. A white element indicates that the respective element is negligible. These elements may then not be evaluated in any of the computational steps wherein the SAH is used. A black element indicates that the respective element is non-negligible. The axes 302 and 304 indicate respective the rows and columns of the SAH matrix 300. The axes 302 and 304 can be considered as [parameters per voxel]×[voxels]. In this example there are 3×3 blocks 310 separated by dashed lines. The SAH matrix 300 has diagonal bands 320 of non-negligible elements. The number of blocks in general is N×N where N is the number of parameter types to be reconstructed, for instance, if T1, T2 and Proton density are reconstructed, then N=3.

Figure 4:
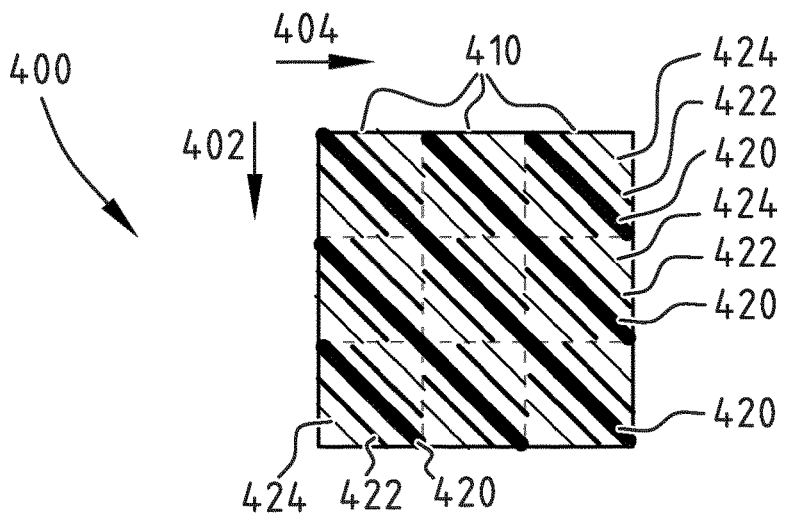
FIG. 4 is a schematic drawing of a sparse Hessian matrix for an applied pulse sequence wherein a non-Cartesian sampling strategy is used.

FIG. 4 shows an example of a determined sparsity pattern for the SAH matrix 400 for non-Cartesian acquisitions such as spiral and/or radial acquisitions, in a similar way as for FIG. 3. In this case, the point spread function propagates in both directions, thus it results into several bands 420, 422 and 424 for each block. The axes 402 and 404 indicate respective the rows and columns of the SAH matrix 400, similar to axes 302 and 304. There are 3×3 blocks 410 separated by dashed lines. The SAH matrix 400 has main diagonal bands 420 of non-negligible elements, and symmetric sub-bands 422 and 424. The thickness or width of the lines formed by the individually marked elements shows the value of the absolute number of the respective SAH matrix element.

Non-Cartesian sequences are more efficient from a data acquisition point-of-view, while Cartesian sequences have the benefit of being much more robust to hardware imperfections (e.g. eddy currents). This is especially the case for gradient-balanced sequences, which are suitable for use in MR-STAT.

Example Relationships Between Radio-Frequency Excitations (Flip Angle Train) and Sparsity Pattern and Smoothness Smoothness of flip angle (RF) excitation determines the width of the bands in the sparsity pattern, as e.g. described for FIG. 4 above. For smooth flip angle trains, taking into account only thin bands will suffice. By this it is meant that only few elements/coefficients per row of the SAH matrix are needed to be evaluated and stored. The bands in the figures above are thus thin, when the flip angle train is smooth. An example of smooth is that the change in flip angle per excitation is equal to or less than 5 degrees. For quickly varying flip angle trains, the opposite holds, that is: wider bands are necessary. This means that more coefficients per row of the SAH matrix are needed to be evaluated and stored. For instance, the bands 320, 420, 422 and 424 in FIGS. 3 and 4 would thus be wider.

Figure 5:
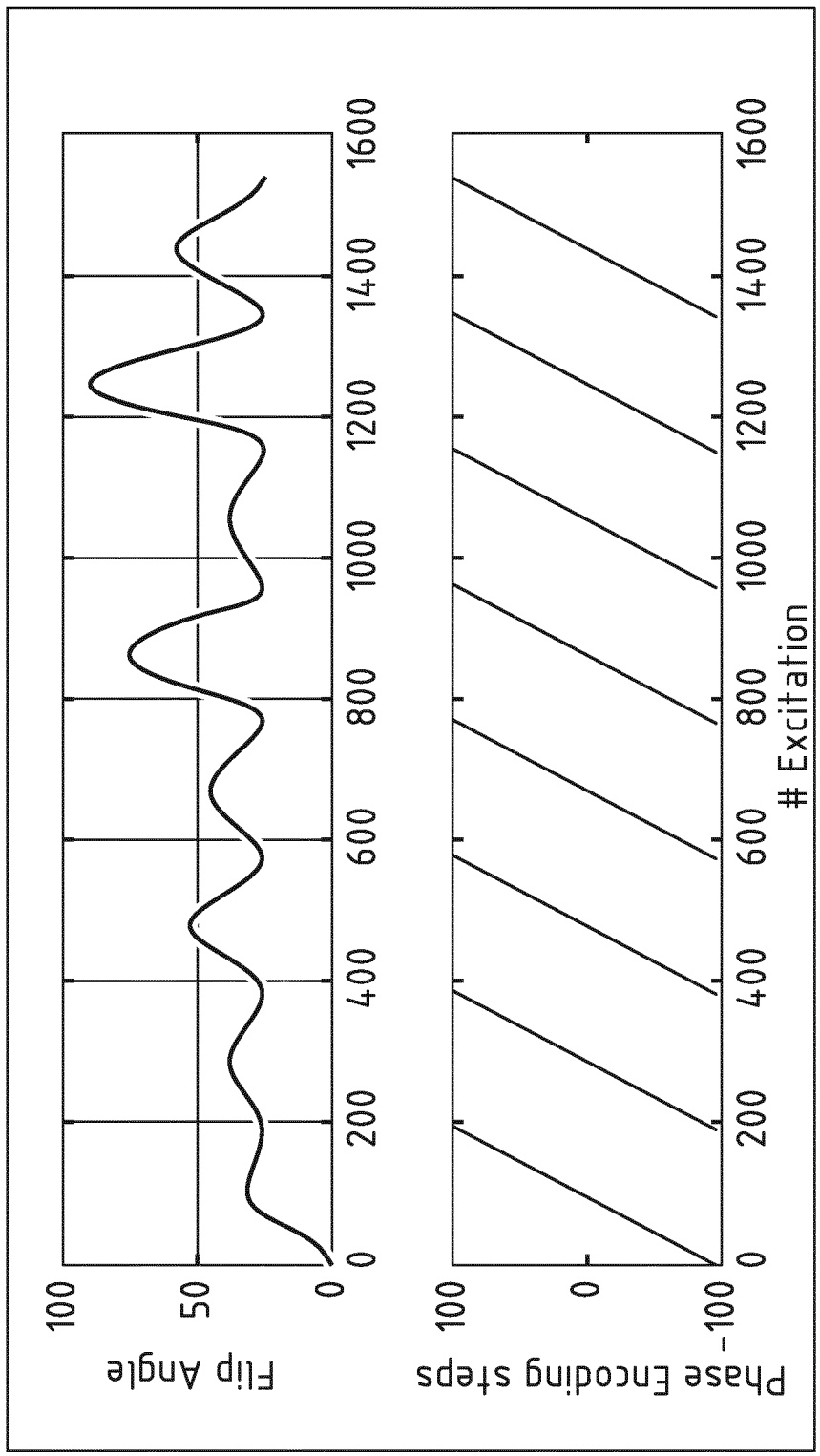
FIG. 5 is a graph illustrating (top) flip angles and (bottom) corresponding phase encoding steps versus excitation number of an example applied pulse sequence.

The required smoothness of the flip angle train depends on the sample, the device used for taking the measurements, the settings thereof, etc., but it is preferred to have some degree of variation in the flip angles to be able to accurately quantify the parameters such as T1, T2, and proton density. One example of a flip angle train is shown in FIG. 5. This FIG. 5 indicates an example of a suitable degree of smoothness of the flip angle train for a multi-parametric quantitative sequence. In particular, FIG. 5 shows a transient-state 2D balanced gradient-echo sequence with varying flip angles and a linear, Cartesian sampling strategy.

Figure 10:
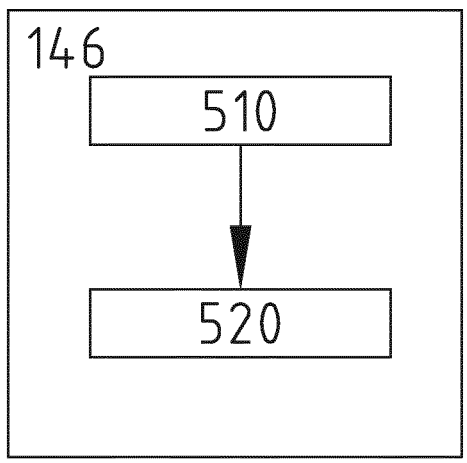
FIG. 10 is a flowchart illustrating an embodiment of updating the set of TDMR signal model parameters of the method of FIG. 1.

Returning now to the method 100 of FIG. 1, and referring now to FIG. 10, in a preferred embodiment, the step vii) of updating 146 comprises obtaining 520 a set of TDMR signal model parameter changes is obtained by solving 510 a linear system of equations based on the sparse Hessian and the gradient of the residual function.

Figure 11:
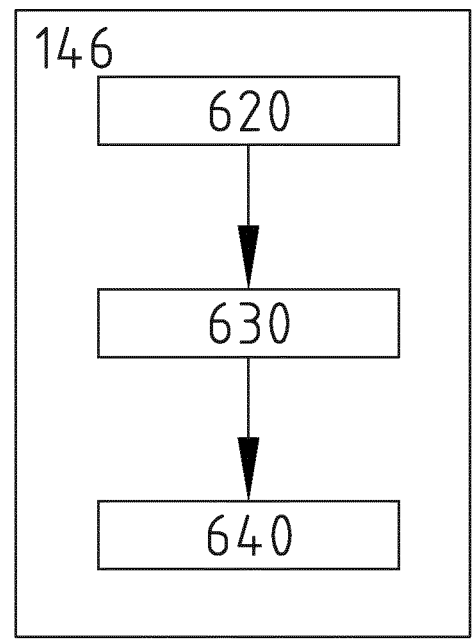
FIG. 11 is a flowchart illustrating another embodiment of updating the set of TDMR signal model parameters of the method of FIG. 1.

Referring now to FIG. 11, in a more preferred embodiment, the step vii) of updating 146 comprises: obtaining 620 a set of TDMR signal model parameter changes by solving 630 a linear system of equations of the sparse Hessian multiplied with the TDMR signal model parameter changes equal to minus the gradient of the residual function, and adding 640 the obtained TDMR signal model parameter changes to the set of TDMR signal model parameters being updated to obtain the updated set of TDMR signal model parameters.

Figure 12:
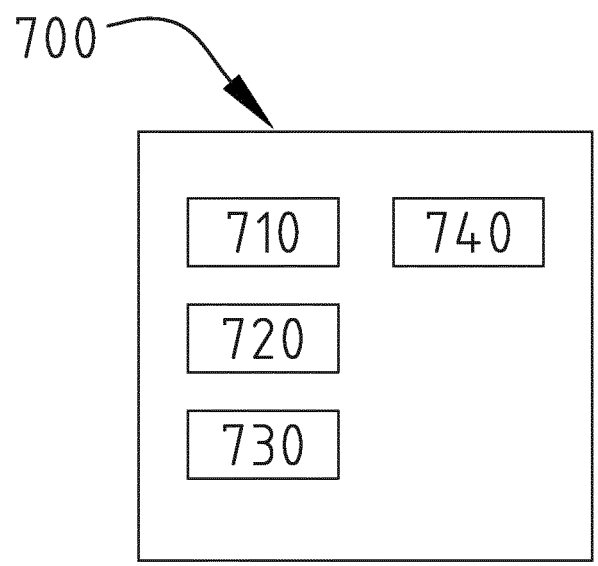
FIG. 12 is a block diagram of an exemplary device for performing determining a spatial distribution according to the present patent disclosure.

Referring to FIG. 12, the device 700, which is an embodiment of the device for determining a spatial distribution of at least one tissue parameter within a sample based on a time domain magnetic resonance, TDMR, signal emitted from the sample after excitation of the sample according to an applied pulse sequence, comprises a processor 710 which is configured to perform any one or more of the methods described above. The device 700 may comprise a storage medium 720 for storing any of the model, parameters, and/or other data required to perform the method steps. The storage medium 720 may also store executable code that, when executed by the processor 710, executes one or more of the method steps as described above. The device 700 may also comprise a network interface 730 and/or an input/output interface 740 for receiving user input. Although shown as a single device, the device 700 may also be implemented as a network of devices such as a system for parallel computing or a supercomputer or the like.

Figure 13:
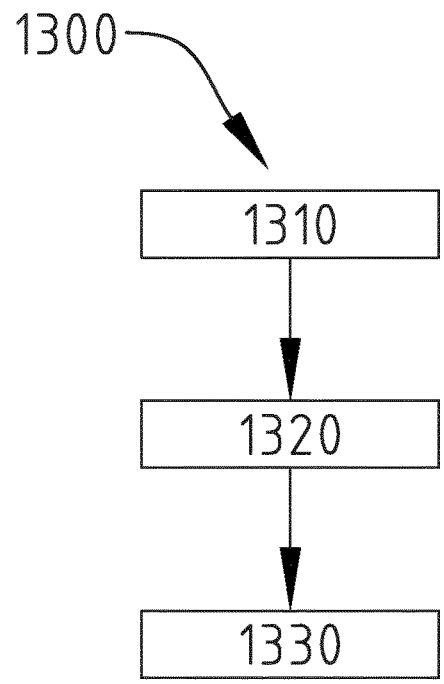
FIG. 13 is a flowchart of a method of performing time-domain magnetic resonance measurements and analysis of a sample.

Referring to FIG. 13, there is shown a method 1300 comprising exciting 1310 a sample, receiving 1320 a signal and analyzing 1330 the signal in a time domain. The analyzing 1330 may comprise the method 100.

Figure 14:
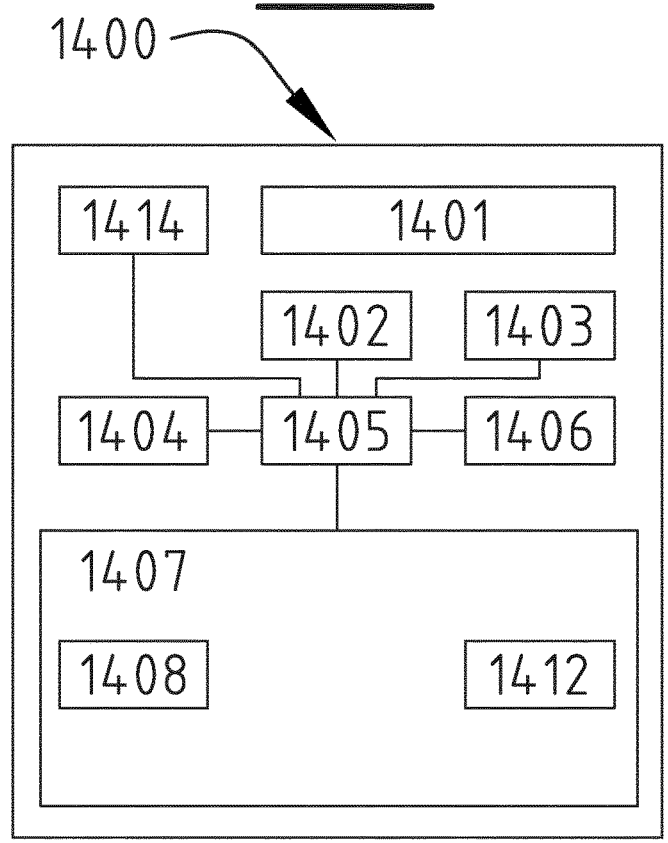
FIG. 14 is a block diagram of an exemplary device for performing time-domain magnetic resonance measurements of a sample.

The method steps 1310 and 1320 may be performed by the MRI device 1400, as shown in FIG. 14. The device 1400 comprises a gradient coil 1420, an excitation device 1400 for transiently exciting the sample 1401, thereby causing the sample 1401 to emit an emitting signal, and a receiving coil 1403 for receiving the emitting signal. The MRI device 1400 may obtain a signal from the sample 1401.

The excitation device 1400 and the receiving coil 1403 are well known in the field of MRI, and are not described herein in greater detail. The device 1400 further comprises a processor 1405 which controls the components of the system including the excitation device 1400 and the receiving coil 1403. The processor 1405 may further control a display 1404 for outputting images and/or status information, and an input device 1406, such as a touch screen, mouse, and keyboard, for receiving commands and auxiliary information from a user. The processor 1405 may comprise a plurality of processing devices that are configured to cooperate to perform a task such as a computation. Alternatively, the processor 1405 consists of a single processing device. Such processing devices, such as central processing unit (CPU), controller, or FPGA, are known in the art. Some well-known elements of MRI devices have been omitted in the drawing and this description in order not to obscure the description.

The device 1400 further comprises a storage means, such as a memory 1407. The memory 1407 may be configured to store, under control of the processor 1405, signals 1412 received from the receiving coil 1403. Reconstructed image data 1413 may be generated by the device 1400 itself, and then includes all the necessary features for performing the method as described herein, such as all the features of the device 700. It is also possible that the image data is reconstructed by an external device, such as the device 700. The reconstruction is done by processing the received signals 1412 by the method described herein, e.g. method 100. The memory 1407 may further store computer code to cause the processor 1405 to perform its tasks. For example, the computer code may include an image acquisition module 1408 for operating a data acquisition based on an acquisition scheme such as illustrated in FIG. 1. That image acquisition module 1408 may cause the excitation device 1400 to transiently excite the sample 1401 thereby causing the sample to emit an emitting signal. Further, the image acquisition module 1408 may cause the processor 1405 to receive and store the emitting signal from the receiving coil 403 which receives the signal emitted by the sample 401.

EXAMPLE IMPLEMENTATION

MR Spin Tomography in Time-Domain (MR-STAT) is a framework for obtaining multi-parametric quantitative MR maps using data from single short scans. A large-scale optimization problem is solved in which spatial localization of signal and estimation of tissue parameters are performed simultaneously by directly fitting a Bloch-based volumetric signal model to the time domain data. In a related art method, a highly parallelized, matrix-free Gauss-Newton reconstruction algorithm is used that can be used to solve the large-scale optimization problem for high-resolution scans.

Theory

In this section the MR-STAT framework as for the related art method is shown and it is summarized how some of the computational challenges in the reconstruction process were previously addressed. Thereafter for an example of an applied pulse sequences it is deduced theoretically that the Hessian matrix has a sparse structure which is exploited in the present method to accelerate MR-STAT reconstructions.

Scalar quantities (both real and complex) are denoted in lower case, vector quantities in bold lower case letters and matrices in bold upper case letters.

MR-STAT Framework

The time evolution of a single spin isochromat $m=(m_x, m_y, m_z)$ with spatial coordinates $r=(x, y, z)$ can be described by the Bloch equations. This time evolution depends on the pulse sequence used (e.g. the RF excitation pulses and the spatial gradients acting on the spin isochromat) and also on its MR-relevant biophysical tissue properties $\theta=(T_1, T_2, \ldots)$. Let the gradient trajectory associated with the pulse sequence be denoted by $k(t)$.

Let $m=m_x+im_y$ be the transverse component of a spin isochromat in the rotating frame. The demodulated time-domain signal s obtained with an MR system is modeled as the volume integral of the transverse magnetisation of all spin isochromats within the field of view V. That is, $$s(t) = \int_V m(\theta(r),t) e^{-2\pi i k(t) \cdot r} dr. \quad (1)$$

In a fully-sampled steady-state sequence, the transverse magnetization loses its time-dependency and a FFT can be used to recover qualitative images. In the more general case of a transient-state sequence the FFT can no longer be directly used to transform between measured time-domain (or k-space) data and image space. Therefore, in the transient-state case, the following is performed. First, the field of view V is discretized into $N_v$ voxels, and equation (1) becomes $$s(t) = \sum_{j=1}^{N_v} m_j(\theta_j, t) e^{-2\pi i k(t) \cdot r_j} \quad (2)$$

Here $m_j$ is the magnetization in voxel j. For gradient-balanced sequences, $m_j$ can be computed by numerical integration of the Bloch equations for individual spin isochromats.

Let $N_t$ be the total number of samples acquired with the MR system's receiver (e.g. receiving coil 1403) and let $t_1, \ldots, t_{N_t}$ denote the sampling times. If the magnetization vector $m_j$ in voxel j is defined as $$m_j := [m_j(\theta_j, t_1), \ldots, (\theta_j, t_{N_t})] \in \mathbb{C}_t^N \quad (3)$$

and the gradient encoding vector for voxel j as $$GR_j := [e^{-2\pi i k(t_1) \cdot r_j}, \ldots, e^{-2\pi i k(t_{N_t}) \cdot r_j}] \in \mathbb{C}_t^N \quad (4)$$

then the discretized signal vector $s \in \mathbb{C}^{N_t}$ can be defined as $$s = \sum_{j=1}^{N_v} m_j \odot GR_j. \quad (5)$$

Here $\odot$ denotes the component-wise vector multiplication. The signal vector s is an example of the TDMR signal model described above. Now let $N_p$ denote the number of distinct parameters per voxel (e.g. including T1, T2, and real and imaginary parts of the proton density). Then s depends on N: $=N_v \times N_p$ different parameters. All parameters are concatenated into a single vector $\alpha \in \mathbb{R}^N$ in such a way that parameters $\{j+kN_v|k=0 \ldots, N_p-1\}$ are the parameters associated with voxel j.

Given a vector of measured time-domain samples $d \in \mathbb{C}^{N_s}$, which is an example of the TDMR signal emitted from the sample as described above, the residual vector $r \in \mathbb{C}^{N_t}$ can be defined as $$r(\alpha) = d - s(\alpha) \quad (6)$$

The residual vector r is an example of the residual vector described above for the method 100. An objective function $f: \mathbb{R}^N \to \mathbb{R}$ can be defined as:

$$f(\alpha) = \tfrac{1}{2} \|r(\alpha)\|_2^2 \quad (7)$$

The objective function f can be used to describe in absolute terms the difference between the emitted TDMR signal and the TDMR signal model as described above. Parameter maps $\alpha^*$, which is an example of spatial distributions for the tissue parameters as described above, are obtained by numerically solving $$\alpha^* = \operatorname{argmin}_\alpha f(\alpha), \quad (8)$$

subject to physical constraints represented by the Bloch equations and attainable intervals for the parameters.

Inexact Gauss-Newton Method

Note that Eq. (8) is a non-linear optimization problem. Such problems can be solved using Newton-based methods. Newton based methods start with an initial guess $\alpha$ and then obtains update steps p in parameter space by solving the linear system $$H(\alpha) p = -g(\alpha). \quad (9)$$

Here $g \in \mathbb{R}^N$ is the gradient of the objective function and $H \in \mathbb{E}^{N \times N}$ is the Hessian matrix which is defined as $$H(\alpha) := \left[ \frac{\partial^2 f}{\partial \alpha_i \partial \alpha_j} \right]_{i,j=1}^N. \quad (10)$$

A difficulty with directly applying the Newton method in MR-STAT is the inherent large scale of the problem. Even for 2D problems the number of parameters N can be in the order of $10^6$. Explicitly forming the Hessian matrix or its inverse is therefore infeasible on present-day computer architectures. A multitude of adaptations to the Newton method have been developed that use approximations to the (inverse) Hessian matrix rather than the (inverse) Hessian matrix itself. One such method that is suitable for large-scale optimization problems it the limited-memory BFGS method ("L-BFGS"). This method directly approximates the inverse Hessian matrix but only requires storage of a limited number of gradient vectors from previous iterations. Alternatively, a commonly used technique in least squares problem is to approximate the Hessian matrix as $\Re(J^H J)$, where $J \in \mathbb{C}^{N_t \times N}$ is the Jacobian matrix defined as $$J(\alpha) := \left[ \frac{\partial r}{\partial \alpha_1} \cdots \frac{\partial r}{\partial \alpha_N} \right], \quad (11)$$

$J^H$ is the Hermitian transpose of J and $\Re$ is the real-part operator. Even though the matrix J is typically too large to store in computer memory as well, it is possible to compute matrix-vector products of the form Jv and $J^H v$ without having to explicitly store J. Given the ability to compute these matrix-vector products, the linear system in Eq. 9 with H replaced by $\Re(J^H J)$ can then be solved in an iterative fashion using Conjugate-Gradient techniques. Rather than solving Eq. 9 to arbitrary precision, the number of iterations performed in this inner loop—viz. solving Eq. 9 for each set of α—is limited, resulting in a so called inexact Gauss-Newton method. This inexact Gauss-Newton method outperforms the L-BFGS method and can be used to reconstruct high resolution parameter maps. A pseudo-algorithm 1 for this matrix-free Gauss-Newton method is as follows:

---

Start of pseudo-algorithm 1
Require: Initial guess α
  ("Outer Loop")
  while !converged do
    1. Compute residual: r(α) = d − s(α)
    2. Compute gradient: g = R($J^H$r)
    3. ("Inner loop") Solve linear system in matrix-free
       fashion: R($J^H$J)p = −g
    4. Update parameters: α = α + p
  end while
End of pseudo-algorithm 1

---

In practice the matrix-free Gauss-Newton method is observed produce good update steps in parameter space p, but this method does require the columns of J to be re-computed for each matrix-vector multiplication. That is, at each iteration of the inner loop, partial derivatives of the signal with respect to each of the N parameters are computed. These computations form the computational bottleneck of the reconstruction algorithm.

Sparse Hessian Approximation

For TDMR signals corresponding to selected applied pulse sequences, $\Re(J^H J)$ has a sparse structure, e.g. banded when using Cartesian acquisitions. Then $\Re(J^H J)$ can be computed and stored upfront (once per outer iteration). The computational effort of subsequent multiplications with the sparse $\Re(J^H J)$ is then negligible and the linear system in Eq. 9 can be solved rapidly by an iterative algorithm to obtain p, resulting in faster MR-STAT reconstructions.

The sparsity of $\Re(J^H J)$ can be worded as follows. The matrix $\Re(J^H J)$ contains information on dependencies between different parameters. In the inexact Gauss-Newton method this matrix is inverted in order to "refocus" the parameter dependencies. For a fully sampled, steady-state sequence, dependencies between parameters associated with different voxels are already eliminated through gradient encoding. That is, matrix entries $\Re(J^H J)_{jk}$ are only non-zero if parameters j and k belong to the same voxel (mod(j−k, Nv)=0). As a result, $\Re(J^H J)$ will consist of $N_p^2$, blocks of diagonal matrices, one for each pair of different parameter types.

In case of a transient-state sequence, the acquired data can be interpreted as data from a steady-state sequence with perturbations on top. If the FFT is applied on such data, the perturbations will result in a convolution with a point-spread function (FFT of perturbations) in image space. That is, a signal originating from one voxel can leak into other voxels. However, in case of Cartesian sampling strategies the point-spread-function associated with the acquisition is (to good approximation) spatially confined to the phase-encoding direction. If on top of that smoothly varying flip angles are employed (resulting in a smooth signal response), the point-spread-function is also limited in width. The matrix $\Re(J^H J)$ is then more sparse.

An example of a formal derivation of the sparsity pattern follows. First of all the magnetization in a voxel j can be expressed as the component-wise product of $m_j$ (which depends on the RF excitation pulses and the parameters in voxel j, e.g. $T_1$, $T_2$, . . . ) and the vector $GR_j$ containing phase terms from spatial encoding gradients.

1. In order to simplify notation, it is assumed that each voxel only has one associated parameter so that the same index can be used to denote a voxel j and its corresponding parameter $\alpha_j$. Since $GR_j$ is independent of the tissue parameters, it follows that $$\frac{\partial (m_j \odot GR_j)}{\partial \alpha_j} = \frac{\partial m_j}{\partial \alpha_j} \odot GR_j \quad (12)$$

In case a regular, fully sampled steady-state sequence is used, $m_j$ is in fact independent of time and each element has the same value to be denoted by $m_j$.

$$(J^H J)_{j,k} = \quad (13)$$
$$\left\langle \frac{\partial m_j}{\partial \alpha_j} \odot GR_j, \frac{\partial m_k}{\partial \alpha_k} \odot GR_k \right\rangle = \frac{\partial m_j^*}{\partial \alpha_j} \frac{\partial m_k}{\partial \alpha_k} \langle GR_j, GR_k \rangle = \frac{\partial m_j^*}{\partial \alpha_j} \frac{\partial m_k}{\partial \alpha_k} \delta_k^j$$

It follows that $J^H J$ is a diagonal matrix.

2. For another example with multiple parameters per voxel ($N_p > 1$), the matrix $J^H J$ will consist of $N_p^2$ blocks of diagonal matrices.

3. Now, for a further example wherein again for sake of simplicity $N_p=1$, a transient-state sequence is instead used. The inner products can be written as sums of inner products over the measured dataset (the TDMR signal) as follows:

$$(J^H J)_{j,k} = \left\langle \frac{\partial m_j}{\partial \alpha_j} \odot GR_j, \frac{\partial m_k}{\partial \alpha_k} \odot GR_k \right\rangle = \quad (14)$$
$$\sum_{s=1}^{N_{PE}} \left( \sum_{l=(s-1)N_{ADC}+1}^{sN_{ADC}} \frac{\partial m_j^*(t_l)}{\partial \alpha_j} \frac{\partial m_k(t_l)}{\partial \alpha_k} e^{2\pi i k(t_l) \cdot r_j} e^{-2\pi i k(t_l) \cdot r_k} \right) =$$
$$\left[ \sum_{s=1}^{N_{PE}} \frac{\partial \hat{m}_{j,s}^*(t_l)}{\partial \alpha_j} \frac{\partial \hat{m}_{k,s}(t_l)}{\partial \alpha_k} e^{2\pi i k_y(t_s) r_{j,y}} e^{-2\pi i k_y(t_s) r_{k,y}} \right]$$
$$\left( \sum_{l=(s-1)N_{ADC}+1}^{sN_{ADC}} e^{2\pi i k_x(t_l) r_{j,x}} e^{-2\pi i k_x(t_l) r_{k,x}} \right)$$

For the term $(\sum_{l=(s-1)N_{ADC}+1}^{sN_{ADC}} e^{2\pi i k_x(t_l)r_{j,x}} e^{-2\pi i k_x(t_l)r_{k,x}})$ in Eq. 14, if the readouts are Cartesian, it follows that $$\left(\sum_{l=(s-1)N_{ADC}+1}^{sN_{ADC}} e^{2\pi i k_x(t_l)r_{j,x}} e^{-2\pi i k_x(t_l)r_{k,x}}\right) = \begin{pmatrix} 0 & r_{j,x} \neq r_{k,x} \\ 1 & r_{j,x} = r_{k,x} \end{pmatrix} \quad (15)$$

That is, dependencies between parameters associated with voxels with different x-coordinates are eliminated.

4. Assuming $r_{j,x} = r_{k,x}$, the other term in square brackets of Eq. 14 can be written as an inner product and using Parseval's Theorem it follows that:

$$(J^H J)_{j,k} = \sum_{s=1}^{N_{PE}} \frac{\partial \hat{m}^*_{j,s}(t_l)}{\partial \alpha_j} \frac{\partial \hat{m}_{k,s}(t_l)}{\partial \alpha_k} e^{2\pi i k_y(t_s)r_{j,y}} e^{-2\pi i k_y(t_s)r_{k,y}} = \quad (16)$$

$$\left\langle \frac{\partial m_j^{py}}{\partial \alpha_j} \odot GR_j^{py}, \frac{\partial m_k^{py}}{\partial \alpha_k} \odot GR_k^{py} \right\rangle =$$

$$\left\langle \mathcal{F}\left(\frac{\partial m_j^{py}}{\partial \alpha_j}\right) * \mathcal{F}(GR_j^{py}), \mathcal{F}\left(\frac{\partial m_k^{py}}{\partial \alpha_k}\right) * \mathcal{F}(GR_k^{py}) \right\rangle =$$

$$\left\langle \mathcal{F}\left(\frac{\partial m_j^{py}}{\partial \alpha_j}\right) * \delta_{r_{j,y}}, \mathcal{F}\left(\frac{\partial m_k^{py}}{\partial \alpha_k}\right) * \delta_{r_{k,y}} \right\rangle$$

If the flip angle train of the applied pulse sequence is smooth, an example of which is shown in FIG. 5, then so is the signal response (the TDMR signal emitted from the sample) and also the partial derivative of the signal response w.r.t. the parameters. Then the Fourier transform has a limited bandwidth. For voxels with a large enough separation in the y-direction, the inner product will then be zero. So, there are only correlations for parameters associated with voxels that are on the same line in the phase encoding direction (same x-coordinates) and close to each other. This results in significant sparsity of the matrix $J^H J$.

5. For the case $N_p = 1$, and assuming coordinates are ordered as $[(x_1, y_1), (x_1, y_2), \ldots, (x_2, y_1), (x_2, y_2), \ldots]$), the matrix $J^H J$ will be a banded matrix. For $N_p > 1$, it will consist of Np blocks of banded matrices (of which only $N_p (N_p+1)/2$ are unique due to symmetry).

Figure 6:
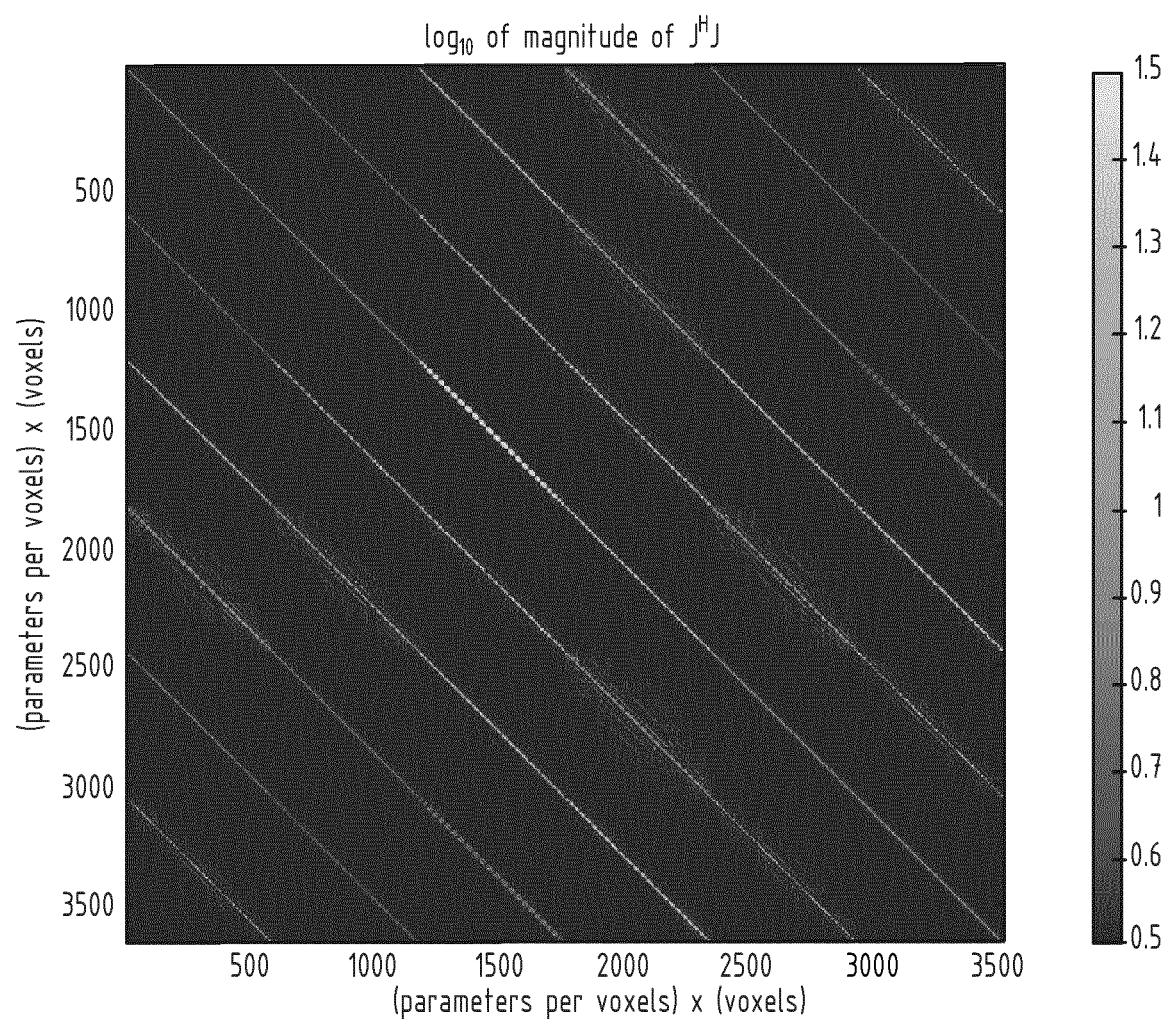
FIG. 6 is a schematic map of a sparse Hessian matrix in color, wherein the color indicates the $\log_{10}$ of the magnitude of each element of the sparse Hessian matrix.
Figure 7:
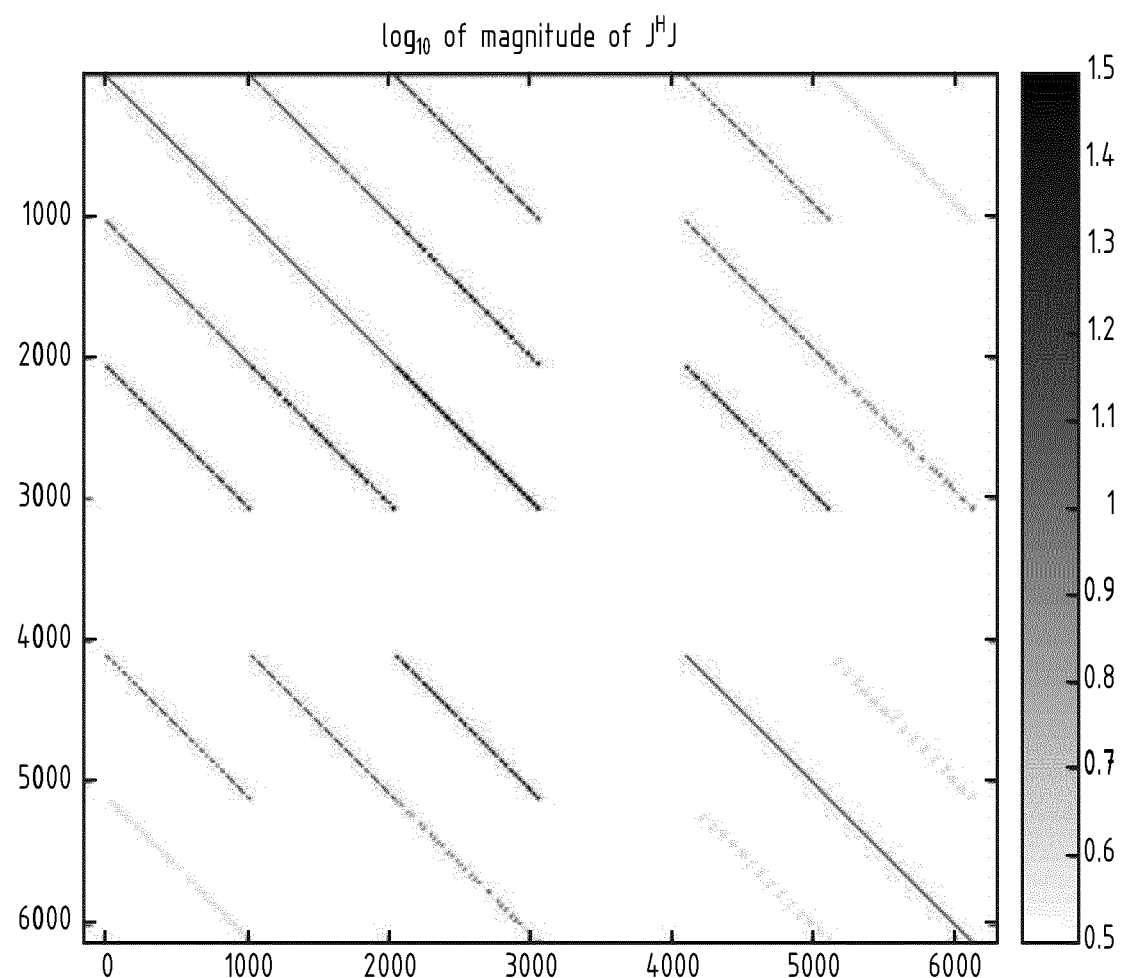
FIG. 7 is a schematic map of another sparse Hessian matrix in greyscale, wherein the shade of grey indicates the $\log_{10}$ of the magnitude of each element of the sparse Hessian matrix.

In FIG. 6, a logarithmic plot of the magnitude of $J^H J$ is shown for a small numerical phantom (for which the full $J^H J$ can be computed). It can be seen in FIG. 6 that the shown $J^H J$ has a block structure (6×6 blocks, one for each pair of distinct parameters) and that each block is, approximately, a sparse, banded matrix. In FIG. 7, a similar logarithmic plot of the magnitude of $J^H J$ for more parameters (and therefore there are more blocks) is shown with the same scale as FIG. 6, but in greyscale.

In pseudo-algorithm 2, an example of the sparse Gauss-Newton method, being an example of the method 100 described above, is shown.

---

Start of pseudo-algorithm 2
Require: Initial guess α
 ("Outer Loop")
 while !converged do
  1. Compute residual: r(α) = d − s(α)
  2. Compute gradient: g = $J^H$r
  3. Compute sparse Hessian: $\tilde{H}$ = $J^H J$
  4. ("Inner loop") Solve linear system in matrix-free fashion: $\tilde{H}$p = −g
  5. Update parameters: α = α + p
 end while
End of pseudo-algorithm 2

---

In this example, it can be seen that in step 4, much less computation time is needed, since this method does not require the columns of J to be re-computed for each matrix-vector multiplication in the inner loop. That is, each iteration of the inner loop, involves solving the linear system $\tilde{H}$p=−g.

Herein, r is an example of the residual vector, d an example of the emitted TDMR signal, s an example of the TDMR signal model, g an example of the calculated gradient of the residual function, $\tilde{H}$ an example of the sparse Hessian, $J^H$ an example of the Hermitian transpose of the Jacobian of the residual vector (or TDMR signal model), J an example of the Jacobian of the residual vector (or TDMR signal model), p is an example of the set of TDMR signal model parameter changes, and α is an example of the (updated or initial) set of TDMR signal model parameters.

In pseudo-algorithm 2, step 1 is an example of step iii) of determining 130 a residual vector in the method 100. Step 2 of pseudo-algorithm 2 is an example of step v) of calculating 142 a gradient of the residual vector of the method 100. Step 3 of pseudo-algorithm 2 is an example of step vi) of calculating 144 a Hessian of the TDMR signal model as a sparse Hessian of the method 100. Step 4 and 5 of pseudo-algorithm 2 are an example of updating 146 the input set of TDMR signal model parameters of the method 100. In particular, step 4 of pseudo-algorithm 2 is an example of obtaining 620 a set of TDMR signal model parameter changes (here p) by solving 630 a linear system of equations of the sparse Hessian multiplied with the TDMR signal model parameter changes equal to minus the gradient of the residual function of FIG. 11 and step 5 of pseudo-algorithm 2 is an example of adding 640 the obtained TDMR signal model parameter changes to the set of TDMR signal model parameters being updated to obtain the updated set of TDMR signal model parameters of FIG. 11.

EXAMPLES

Example Pulse Sequence

The related art matrix-free Gauss-Newton method and the sparse Gauss-Newton (GN) method of the present disclosure were compared on synthetically generated data, on data from gel phantoms and on in-vivo brain data.

In all cases, a 2D gradient-balanced, transient-state pulse sequence was used with a flip angle that smoothly varies each TR (repetition time) and a linear, Cartesian k-space filling, as shown in FIG. 5. For the synthetic experiment, the sequence was used to simulate data with a (simulated) scan time of 7.8 seconds. For the gel phantom and in-vivo brain experiments, the transient-state sequence was implemented on a 1.5 Philips-Ingenia MR-System and was used to scan a healthy volunteer with a 13-channel receive head-coil. The scan time was 6.8 seconds with a scan resolution of 1×1×5 mm$^3$.

From the simulated/acquired data, $T_1$, $T_2$, $|B_1^+|$ and proton density maps were reconstructed. For the matrix-free GN-method, the number of inner iterations was limited to 10 because of time constraints. For the sparse GN-method, reconstructions were performed wherein a number of 15 of subdiagonals were computed for each parameter pair, resulting in storage of 0.04% needed compared to the full matrix size for the in-vivo brain dataset. The reconstruction algorithms were written in the open-source Julia programming language and were run on a computing cluster using 64 cores.

Results

Figure 8:
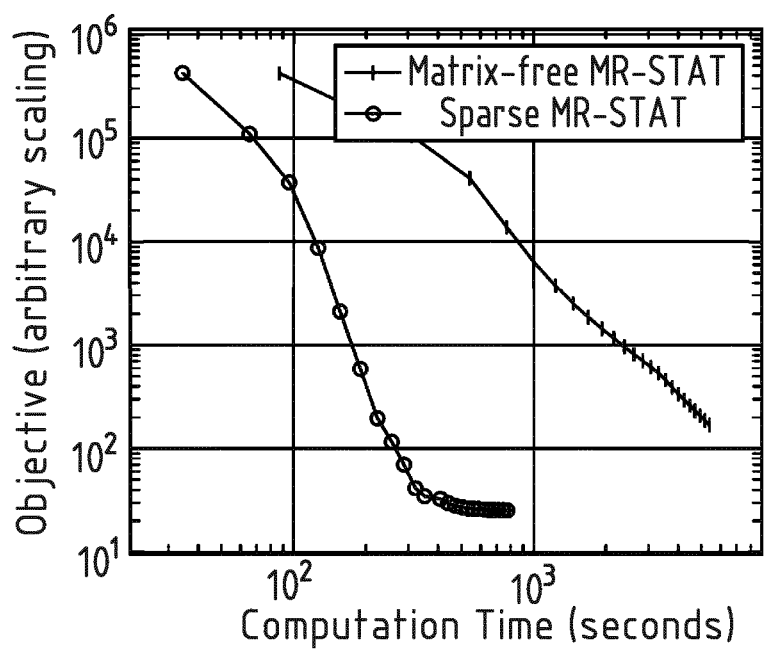
FIG. 8 is a log-plot of the logarithm of an objective function versus the logarithm of the computation time of a related art method versus an exemplary method of the present patent disclosure.

In FIG. 8, convergence curves for the matrix-free and the sparse GN-methods are shown. As can bee seen, an order of magnitude decrease in reconstruction time compared to the matrix-free GN-method is obtained.

Figure 9:
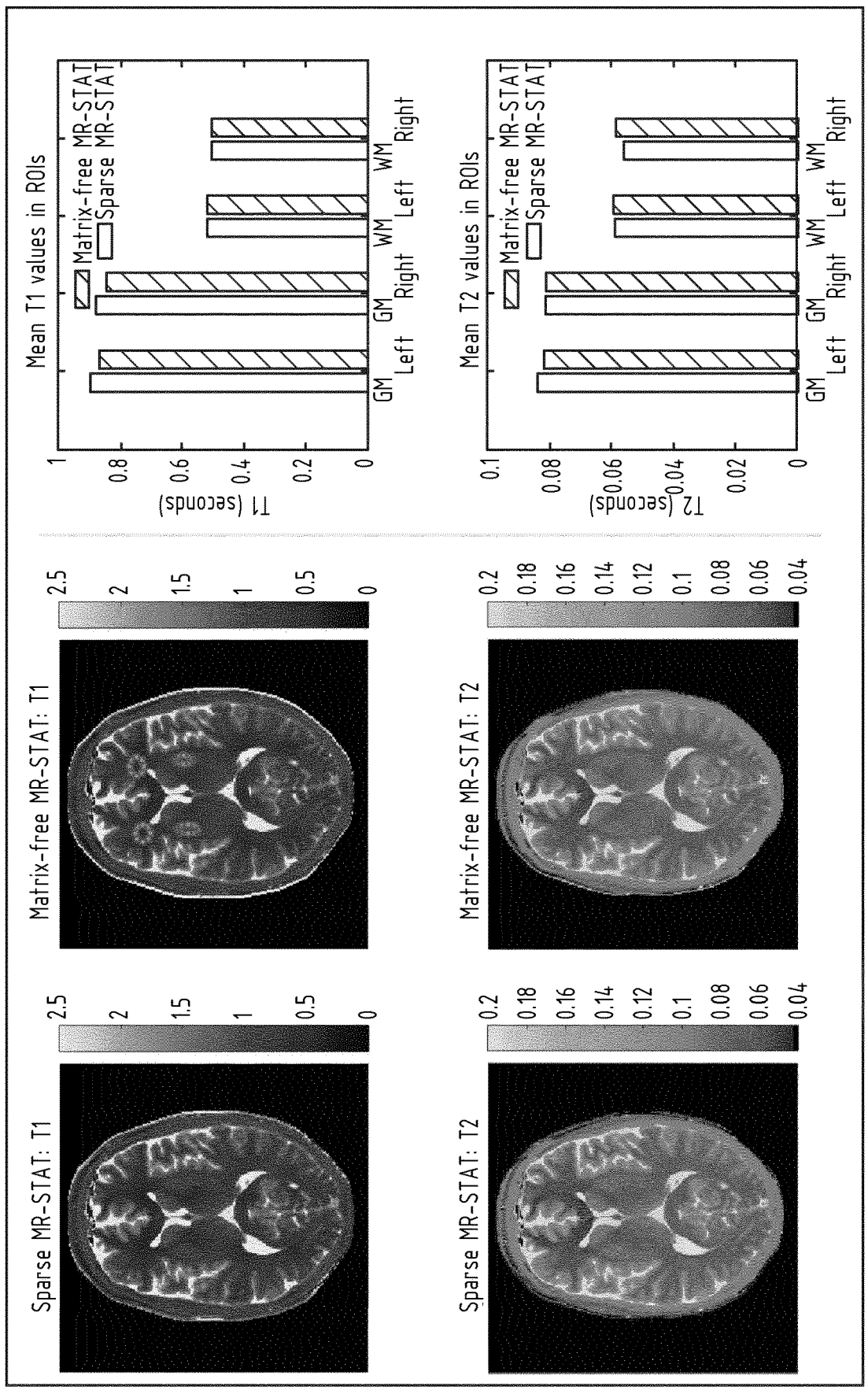
FIG. 9 is a (left) set of two reconstructed in-vivo T1 and T2 maps as obtained by an exemplary method of the present disclosure, (middle) a set of two reconstructed in-vivo T1 and T2 maps of a related art method, and (right) a comparison of the obtained mean T1 and mean T2 values of the compared methods.

FIG. 9 shows the reconstructed in-vivo $T_1$ and $T_2$ maps for the sparse GN-method and a comparison with the matrix-free GN-method of a human brain. On the right side are shown mean T1 values (top) and mean T2 values (bottom) for the well known parameters GM left (gray matter in the left side of the brain), GM right (gray matter in the right side of the brain), WM left (white matter in left side of the brain) and WM right (white matter in the right side of the brain). Using the sparse GN-method the reconstruction time was 50 minutes whereas for the matrix-free GN-method it was 320 minutes.

Even though in the sparse GN-method an approximation of $J^H J$ is used (which itself approximates the Hessian matrix), the optimization algorithm converges to the same parameter maps. In fact, the method can even lead to better update steps (as seen in FIG. 8) because the number of iterations for the inner loop is not limited, allowing the present method to better take into account the curvature of the objective function.

Figure 15:
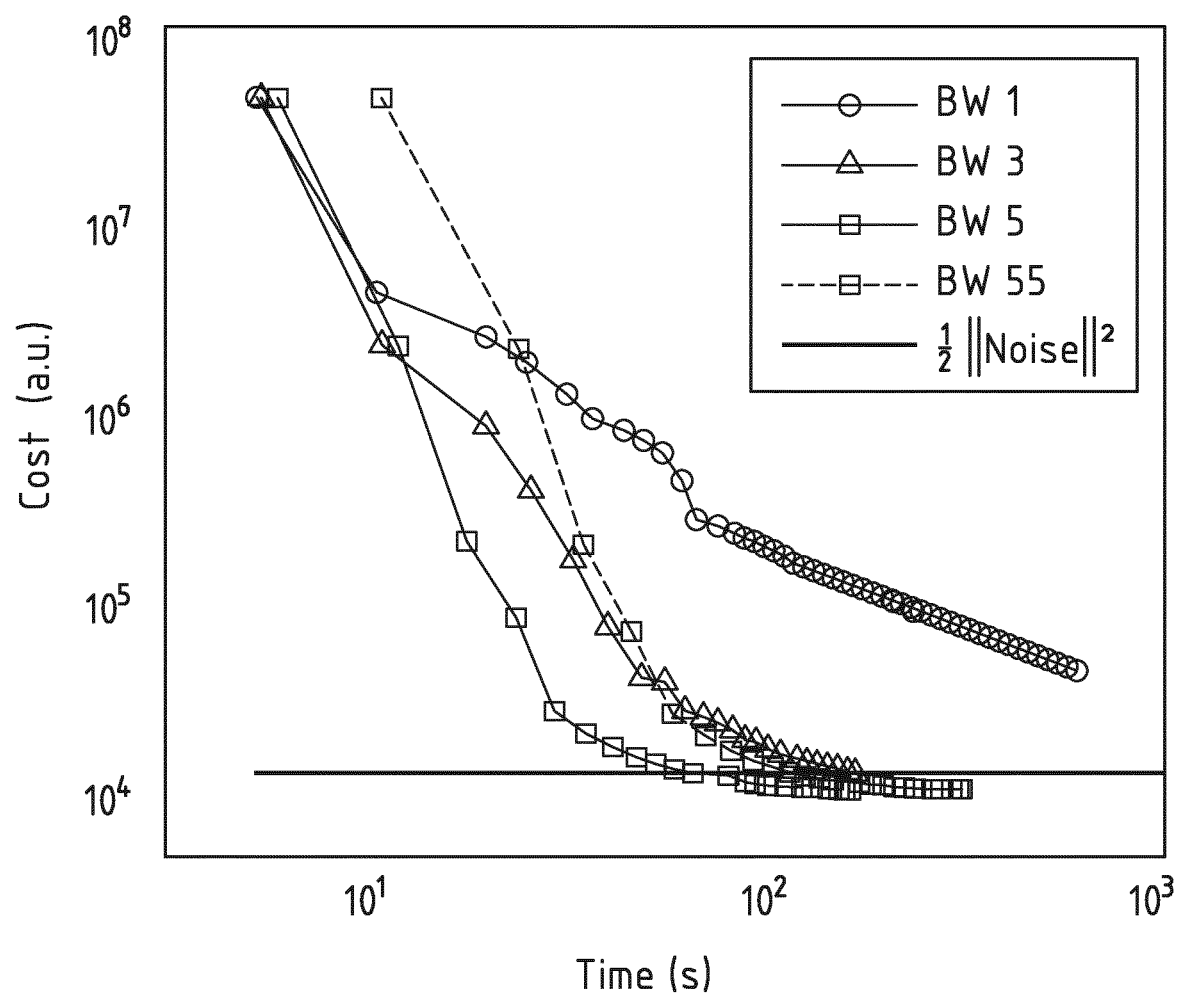
FIG. 15 is a log plot of the logarithm of an objective function versus the logarithm of the computation time of methods of the present patent disclosure wherein a width of diagonal bands of the sparse Hessian matrix is varied.

It will be apparent from the above that a width of the diagonal bands, such as the diagonal bands in the determined sparse Hessian matrices of FIGS. 3 and 4, is determined based on, or in other words using, the applied pulse sequence. One additional advantage thereof is that the computation time is reduced when the width (or bandwidth) is larger than 1. This effect is shown in FIG. 15, wherein it is seen that a width of 1 results in computation times that are at least 50 or even lager than a 100 times longer than when a width of 5 is applied. The data of FIG. 15 corresponding to a (band)width (BW) 5 in FIG. 15 is similar to the data shown in FIG. 8 for the Sparse MR-STAT. Computations shown in FIG. 15 may, for example, be done using linear Cartesian sampling and a smooth RF train (such as the one of FIG. 5), but it will be apparent that other types of sampling and RF trains may also be used.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

The functions of the various elements shown in the figures, including any functional blocks labelled as "units", "processors" or "modules", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "unit", "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Whilst the principles of the described methods and devices have been set out above in connection with specific embodiments, it is to be understood that this description is merely made by way of example and not as a limitation of the scope of protection which is determined by the appended claims.

The disclosure further comprises the following clauses:

1. A method for determining a spatial distribution of at least one tissue parameter within a sample based on a time domain magnetic resonance, TDMR, signal emitted from the sample after excitation of the sample according to an applied pulse sequence, the method comprising:
   i) determining a TDMR signal model to approximate the emitted time domain magnetic resonance signal, wherein the TDMR signal model is configured to be dependent on TDMR signal model parameters comprising:
      the spatial distribution of the at least one tissue parameter within the sample; and
      the applied pulse sequence;
   ii) estimating an initial set of TDMR signal model parameters;
   iii) determining a residual vector being representative for a difference between the emitted TDMR signal and the TDMR signal model, based on the initial set of TDMR signal model parameters as an input;
   iv) determining an updated set of TDMR signal model parameters based on the input set of parameters by
   v) calculating a gradient of the residual vector;
   vi) calculating a Hessian of the TDMR signal model as a sparse Hessian wherein a sparsity pattern of the Hessian is based on the applied pulse sequence; and
   vii) updating the initial set of TDMR signal model parameters based on the calculated gradient and calculated Hessian;
   viii) repeating steps iii), iv), v), vi) and vii) using the updated set of TDMR signal model parameters as the input until the difference between the emitted TDMR signal and the TDMR signal model is smaller than a predefined threshold or until a predetermined number of repetitions is completed, thereby obtaining a final updated set of TDMR signal model parameters; and
   ix) extracting from the final updated set of TDMR signal model parameters the spatial distribution of the at least one tissue parameter.

2. The method according to clause 1, wherein the applied pulse sequence comprises a gradient encoding pattern and/or a radio frequency excitation pattern, and wherein the sparsity pattern of the Hessian is determined based on the gradient encoding pattern and/or the radio frequency excitation pattern.

3. The method according to clause 1 or 2, wherein the Hessian is calculated as the product of a Jacobian of the residual vector and a Hermitian transpose of the Jacobian of the residual vector.

4. The method according to any one of the previous clauses, wherein the applied pulse sequence is configured to yield any one of a Cartesian acquisition, radial acquisition, or spiral acquisition.

5. The method according to clause 4, wherein the gradient encoding pattern of the applied pulse sequence is configured to yield a Cartesian acquisition, such that a corresponding point-spread function only propagates in a phase encoding direction.

6. The method according to any one of the previous clauses, wherein the applied pulse sequence is configured to yield varying flip angles.

7. The method according to clause 6, wherein the radio frequency excitation pattern of the applied pulse sequence is configured to yield smoothly varying flip angles, such that a corresponding point-spread function is spatially limited in a width direction.

8. The method according to any one of the previous clauses, wherein the at least one tissue parameter comprises any one of a T1 relaxation time, T2 relaxation time, T2* relaxation time and a proton density, or a combination thereof.

9. The method according to any one of the previous clauses, wherein calculating the gradient of the residual vector comprises multiplying the residual vector with a Hermitian transpose of a Jacobian of the residual vector.

10. The method according to any one of the previous clauses, wherein the TDMR signal model is a Bloch based volumetric signal model.

11. The method according to any one of the previous clauses, wherein the sparsity pattern in the Hessian is determined by the gradient encoding pattern of the applied pulse sequence.

12. The method according to any one of the previous clauses, wherein the Hessian is calculated as a sparse Hessian comprising a number of diagonal bands.

13. The method according to clause 12, wherein the number of diagonal bands in the Hessian is determined by the gradient encoding pattern of the applied pulse sequence.

14. The method according to clause 12 or 13, wherein a width of any one of the number of diagonal bands is determined by the radio frequency excitation pattern of the applied pulse sequence.

15. The method according to any one of the previous clauses, wherein the sparse Hessian is constant for each set of TDMR signal model parameters.

16. The method according to any one of the previous clauses, wherein the step vii) of updating comprises:
obtaining a set of TDMR signal model parameter changes by solving a linear system of equations of the sparse Hessian multiplied with the TDMR signal model parameter changes equal to minus the gradient of the residual function, and
adding the obtained TDMR signal model parameter changes to the set of TDMR signal model parameters being updated to obtain the updated set of TDMR signal model parameters.

17. A device for determining a spatial distribution of at least one tissue parameter within a sample based on a time domain magnetic resonance, TDMR, signal emitted from the sample after excitation of the sample according to an applied pulse sequence, the device comprising a processor which is configured to:
i) determine a TDMR signal model to approximate the emitted time domain magnetic resonance signal, wherein the TDMR signal model is configured to be dependent on TDMR signal model parameters comprising:
the spatial distribution of the at least one tissue parameter within the sample; and
the applied pulse sequence;
ii) estimate an initial set of TDMR signal model parameters;
iii) determine a residual vector being representative for a difference between the emitted TDMR signal and the TDMR signal model, based on the initial set of TDMR signal model parameters;
iv) determine an updated set of TDMR signal model parameters by
v) calculate a gradient of the residual vector;
vi) calculate a Hessian of the TDMR signal model as a sparse Hessian wherein a sparsity pattern of the Hessian is based on the applied pulse sequence; and
vii) update the initial set of TDMR signal model parameters based on the calculated gradient and calculated Hessian;
viii) repeat steps iii), iv), v), vi) and vii) for the updated set of TDMR signal model parameters until the difference between the emitted TDMR signal and the TDMR signal model is smaller than a predefined threshold or until a predetermined number of repetitions is completed, whereby a final updated set of TDMR signal model parameters is obtained; and
ix) extract from the final updated set of TDMR signal model parameters the spatial distribution of the at least one tissue parameter.

18. A computer program product comprising computer-executable instructions for performing the method of any one of the clauses 1-16, when the program is run on a computer.

The invention claimed is:

1. A method for determining a spatial distribution of at least one tissue parameter within a sample based on a time domain magnetic resonance, TDMR, signal emitted from the sample after excitation of the sample according to an applied pulse sequence, the method comprising:
i) determining a TDMR signal model to approximate the emitted time domain magnetic resonance signal, wherein the TDMR signal model is configured to be dependent on TDMR signal model parameters comprising:
the spatial distribution of the at least one tissue parameter within the sample; and
the applied pulse sequence;
ii) estimating an initial set of TDMR signal model parameters;
iii) determining a residual vector being representative for a difference between the emitted TDMR signal and the TDMR signal model, based on the initial set of TDMR signal model parameters as an input;

iv) determining an updated set of TDMR signal model parameters by v) calculating a gradient of the residual vector;

vi) calculating a sparse Hessian of the TDMR signal model, the calculated sparse Hessian having a sparsity pattern that is calculated using the applied pulse sequence, thereby knowing in advance the coefficients of the sparse Hessian to be calculated; and vii) updating the initial set of TDMR signal model parameters based on the calculated gradient and calculated Hessian;

viii) repeating steps iii), iv), v), vi) and vii) using the updated set of TDMR signal model parameters as the input until the difference between the emitted TDMR signal and the TDMR signal model is smaller than a predefined threshold or until a predetermined number of repetitions is completed, thereby obtaining a final updated set of TDMR signal model parameters; and ix) extracting from the final updated set of TDMR signal model parameters the spatial distribution of the at least one tissue parameter.

2. The method according to claim 1, wherein the applied pulse sequence comprises a gradient encoding pattern and/or a radio frequency excitation pattern, and wherein the sparse Hessian comprises a number of diagonal bands, wherein a width of any one of the number of diagonal bands is determined by the radio frequency excitation pattern and/or the gradient encoding pattern of the applied pulse sequence.

3. The method according to claim 1, wherein the calculating the sparse Hessian comprises determining elements of the Hessian matrix which are non-negligible, wherein preferably the elements of the Hessian matrix are determined to be non-negligible when the absolute value of each element is above a threshold value, more preferably wherein the elements of the Hessian matrix are determined to be non-negligible when the absolute value of the product of a Jacobian of the residual vector and the Hermitian transpose of the Jacobian of the residual vector is larger than a predetermined value.

4. The method according to claim 2, wherein the width of any one of the number of diagonal bands is larger than 1, wherein preferably the width of any one of the number of diagonal bands is in the range of 2 to 55, more preferably 3 to 8, most preferably 3.

5. The method according to claim 1, wherein the Hessian is calculated as the product of a Jacobian of the residual vector and a Hermitian transpose of the Jacobian of the residual vector.

6. The method according to claim 1, wherein the applied pulse sequence is configured to yield any one of a Cartesian acquisition, radial acquisition, or spiral acquisition.

7. The method according to claim 6, wherein the gradient encoding pattern of the applied pulse sequence is configured to yield a Cartesian acquisition, such that a corresponding point-spread function only propagates in a phase encoding direction.

8. The method according to claim 1, wherein the applied pulse sequence is configured to yield varying flip angles.

9. The method according to claim 7, wherein the radio frequency excitation pattern of the applied pulse sequence is configured to yield smoothly varying flip angles, such that a corresponding point-spread function is spatially limited in a width direction.

10. The method according to claim 1, wherein the at least one tissue parameter comprises any one of a T1 relaxation time, T2 relaxation time, T2* relaxation time and a proton density, or a combination thereof.

11. The method according to claim 1, wherein calculating the gradient of the residual vector comprises multiplying the residual vector with a Hermitian transpose of a Jacobian of the residual vector.

12. The method according to claim 1, wherein the TDMR signal model is a Bloch based volumetric signal model.

13. The method according to claim 2, wherein the number of diagonal bands in the Hessian is determined by the gradient encoding pattern of the applied pulse sequence.

14. The method according to claim 1, wherein the sparse Hessian is constant for each set of TDMR signal model parameters.

15. The method according to claim 1, wherein the step vii) of updating comprises:

obtaining a set of TDMR signal model parameter changes by solving a linear system of equations of the sparse Hessian multiplied with the TDMR signal model parameter changes equal to minus the gradient of the residual function, and adding the obtained TDMR signal model parameter changes to the set of TDMR signal model parameters being updated to obtain the updated set of TDMR signal model parameters.

16. A device for determining a spatial distribution of at least one tissue parameter within a sample based on a time domain magnetic resonance, TDMR, signal emitted from the sample after excitation of the sample according to an applied pulse sequence, the device comprising a processor which is configured to:

i) determine a TDMR signal model to approximate the emitted time domain magnetic resonance signal, wherein the TDMR signal model is configured to be dependent on TDMR signal model parameters comprising:

the spatial distribution of the at least one tissue parameter within the sample; and the applied pulse sequence;

ii) estimate an initial set of TDMR signal model parameters;

iii) determine a residual vector being representative for a difference between the emitted TDMR signal and the TDMR signal model, based on the initial set of TDMR signal model parameters as an input;

iv) determine an updated set of TDMR signal model parameters by v) calculate a gradient of the residual vector;

vi) calculate a sparse Hessian of the TDMR signal model, the calculated sparse Hessian having a sparsity pattern that is calculated using the applied pulse sequence, thereby knowing in advance the coefficients of the sparse Hessian to be calculated; and vii) update the initial set of TDMR signal model parameters based on the calculated gradient and calculated Hessian;

viii) repeat steps iii), iv), v), vi) and vii) for the updated set of TDMR signal model parameters as the input until the difference between the emitted TDMR signal and the TDMR signal model is smaller than a predefined threshold or until a predetermined number of repetitions is completed, whereby a final updated set of TDMR signal model parameters is obtained; and ix) extract from the final updated set of TDMR signal model parameters the spatial distribution of the at least one tissue parameter.

* * * * *